United States Patent

Hsue et al.

[11] Patent Number: 5,828,036
[45] Date of Patent: Oct. 27, 1998

[54] METHOD AND APPARATUS FOR REFLOWING AND ANNEALING BOROPHOSPHOSILICATE GLASS

[75] Inventors: Chen-Chiu Hsue, Hsin-chu; Edward Houn, Tainan, both of Taiwan

[73] Assignee: United Microelectronics Corporation, Taiwan

[21] Appl. No.: 499,299

[22] Filed: Jul. 7, 1995

Related U.S. Application Data

[62] Division of Ser. No. 289,650, Aug. 12, 1994.

[51] Int. Cl.⁶ .......................... C23L 16/00; H01L 21/316
[52] U.S. Cl. .......................... 219/390; 118/725; 427/255
[58] Field of Search .................................. 219/390, 405, 219/411; 118/50.1, 724, 725; 392/416, 418; 427/255; 437/247

[56] References Cited

U.S. PATENT DOCUMENTS

| | | | |
|---|---|---|---|
| 4,513,026 | 4/1985 | Miyamoto et al. | 427/255 |
| 4,992,301 | 2/1991 | Shishiguchi et al. | 118/724 |
| 5,015,330 | 5/1991 | Okumura et al. | 118/50.1 |
| 5,029,554 | 7/1991 | Miyashita et al. | 118/724 |
| 5,076,206 | 12/1991 | Bailey et al. | 118/724 |
| 5,094,984 | 3/1992 | Liu et al. | 437/235 |
| 5,252,133 | 10/1993 | Miyazaki et al. | 118/725 |
| 5,329,095 | 7/1994 | Okase | 219/390 |
| 5,383,984 | 1/1995 | Shimada et al. | 118/725 |
| 5,506,176 | 4/1996 | Takizawa | 437/247 |

FOREIGN PATENT DOCUMENTS

| | | |
|---|---|---|
| 61-245539 | 10/1986 | Japan . |
| 3-273630 | 12/1991 | Japan . |
| 4-102324 | 4/1992 | Japan . |

*Primary Examiner*—Teresa J. Walberg
*Assistant Examiner*—J. Pelham
*Attorney, Agent, or Firm*—Rabin, Champagne, & Lynt, P.C.

[57] ABSTRACT

A furnace with a large quartz tube with a gas inlet on one end, and a large opening at the other end for introducing and withdrawn wafers on a support. At least one small quartz tube is provided within and adjacent the sidewall of the large tube that has a gas inlet on one end outside of the large tube, and apertures in the sidewall. In use, a major stream of gas is provided by a gas inlet on the large tube that flows longitudinally through the large tube. A series of secondary streams of gas are provided from the apertures in the small tube that flow perpendicular to the major stream and across the surfaces of the wafers.

8 Claims, 4 Drawing Sheets

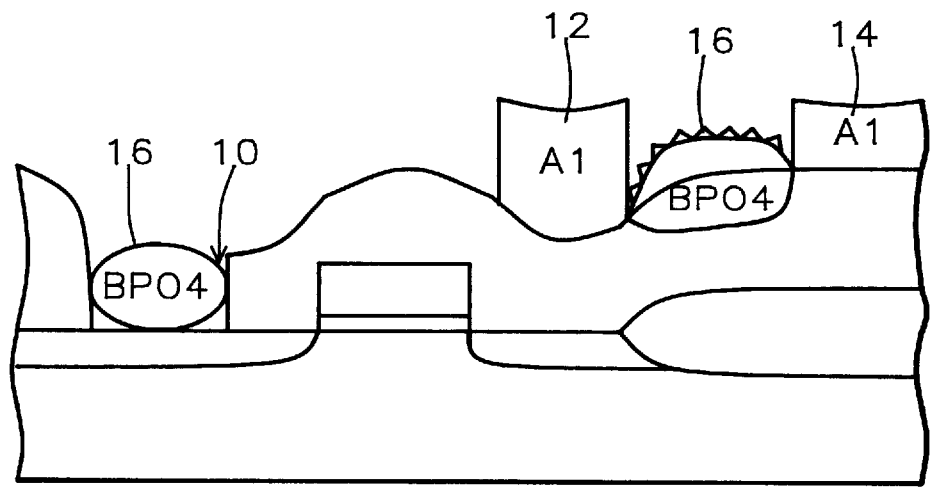
FIG. 1 - Prior Art
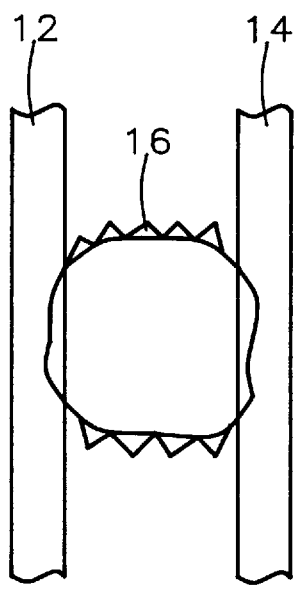
FIG. 2 - Prior Art

METHOD AND APPARATUS FOR REFLOWING AND ANNEALING BOROPHOSPHOSILICATE GLASS

This is a divisional of application Ser. No. 08/289,650 filed Aug. 12, 1994.

BACKGROUND OF THE INVENTION (1) Field of the Invention

The present invention relates to integrated semiconductor device fabrication and apparatus therefor. More specifically, the invention relates to improved annealing and reflow methods and apparatus for annealing and reflowing.

(2) Description of the Invention

Semiconductor devices are normally encapsulated in a glass or similar passivation layer in order to chemically, mechanically and electrically insulate the enclosed array from the environments that the device will be subjected to before, during and after the time the array or device is tested and/or used for its chosen task. Glasses such as Borophosphosilicate glass (BPSG) is frequently used as a passivation layer or interlayer dielectric film because (1) the BPSG layer has a substantially lower reflow temperature than most other passivation materials, and (2) the presence of boron and phosphorus atoms in approximately equal concentrations in the layer insures that such material will not produce a net N type or P type average carrier density of substantial magnitude so as to cause inversion or other problems. However, BPSG has problems. BPSG is normally deposited, annealed and reflowed in a tube furnace made of quartz. The furnace consists of an elongated tube that is open at one end for introducing semiconductor wafers, and has a single gas inlet on the opposite end. The wafers are positioned vertically, in spaced relation, on a suitable support and placed in the furnace tube. A loose fitting enclosure is placed over the open end and a heated gas introduced into the heated furnace through the gas inlet. The gas flows longitudinally down the length of the tube furnace past the wafers which are positioned with their major or flat surfaces perpendicular to the flow. With this apparatus, it has been observed that during reflow and annealing operations, $BPO_4$ crystals have a tendency to form by the re-crystallization of BPSG layer, particularly near the center of the wafers. This leads to problems, more particularly as the dimensions of the circuitry on the wafer are reduced in order to obtain greater miniaturization. The $BPO_4$ crystals may form about contact openings 10, as illustrated in the cross sectional view of a device in FIG. 1. Since $BPO_4$ crystals can not be removed by either wet or dry etch, they will cause the poor contact opening and/or metal bridging.

SUMMARY OF THE INVENTION

An object of this invention is to provide an improved furnace for reflowing and annealing BPSG layers on substrates that prevents the formation of $BPO_4$ crystals in the layer.

Another object of the invention is to provide a new method of reflowing and annealing BPSG layers on semiconductor substrates wherein the formation of $BPO_4$ crystals in or on the BPSG layer is presented or minimized.

In accordance with the above objectives, there is provided an improved furnace for annealing and reflowing BPSG. The furnace has a large quartz furnace tube with an opening at one end for introducing and withdrawing semiconductor substrates into and out of the furnace. On the opposite end is provided a main gas inlet. At least one small quartz tube extends into the furnace tube and is positioned adjacent the walls thereof. The small tubes have small openings in the side wall that direct gas in a direction perpendicular to the longitudinal axes of the furnace tube. The tubes have the end in the furnace sealed. The opposite end has a gas inlet.

In the method of the invention a plurality of semiconductor wafers are mounted on a support in spaced relationship and introduced in a furnace chamber. The substrates are heated and a first stream of gas is flowed perpendicular to the wafer surfaces, and second streams of gases are flowed across the wafer surfaces.

BRIEF DESCRIPTION OF THE DRAWINGS

FIG. 1 is a crossectional view of a typical integrated circuit, semiconductor device in which there is illustrated the problems relating to conventional prior art BPSG technology.

FIG. 2 is a top view of a portion of FIG. 1 that illustrates prior art problems.

DESCRIPTION OF PREFERRED EMBODIMENTS

Figure 3:
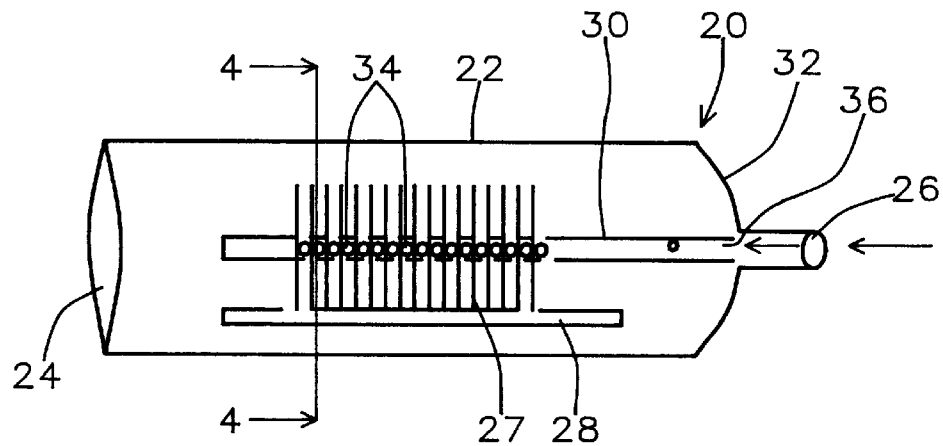
FIG. 3 is a front view of a preferred embodiment of a tube furnace of the invention.
Figure 4:
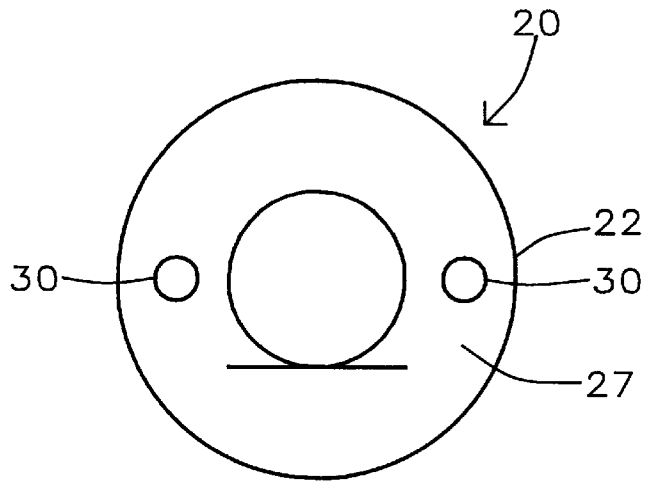
FIG. 4 is a crossectional view taken on line 4—4 of FIG. 3.
Figure 5:
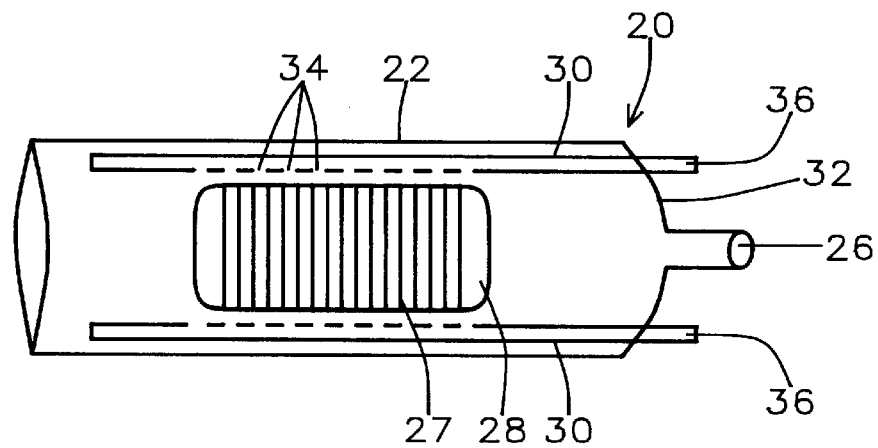
FIG. 5 is a top view of FIG. 3.

Referring now to the drawing, there is illustrated in FIGS. 3, 4, and 5, a preferred specific embodiment of the improved furnace of the invention. The furnace 20 consists of an elongated furnace tube 22, typically made of fused quartz. Tube 22 has an open end 24 for introducing and withdrawing semiconductor wafers for processing. On the opposite end, there is provided a main gas inlet 26 for introducing gasses into the tube 22. The semiconductor wafers 27, sometimes referred to as substrates, are in practice, supported on a suitable support 28 referred to as a boot, for introduction into the furnace 20. As shown, the wafers 27 are positioned in spaced, upright position with the surfaces being perpendicular to the longitudinal axis of the tube 22. Gas introduced into inlet 26 will pass longitudinally down the tube 22 and out of opening 24, which is usually covered by a loose fitting cover, not shown. Two small tubes 30, normally quartz, are mounted in tube 22 adjacent the wall. The tubes 30 enter the tube 22 through openings in spherical wall 32. The tubes 30 each have a plurality of small openings 34 spaced along their length. The holes 34 are provided, at least, in the proximity of the wafers 27 when they are located in the tube 22. The tubes have an open end outside of the tube 22 which serves as a gas inlet 36. The opposite ends of the tubes 30 are sealed so that gas escapes through holes 34.

The size of furnace 20 can be any suitable size to accommodate the size of wafers 27 to be processed. The wafers 27 have a typical diameter of 100 to 200 mm. A furnace to accommodate the typical wafer has a furnace tube with an inside diameter of approximately 125 to 250 mm, and a length of approximately 150 to 250 cm. The small quartz tubes 30 have as diameter of 10 mm, with the apertures spaced 20 mm, with diameters on the order of 2 mm.

Figure 6A:
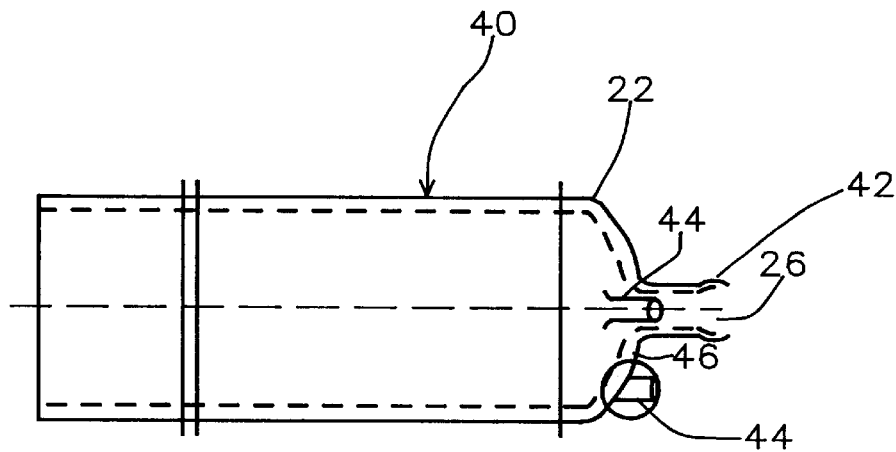
FIG. 6A, 6B and 6C are a front view, an end view of the open end, and an opposite end view, respectively, of another preferred specific embodiment of the furnace of the invention.
Figure 6B:
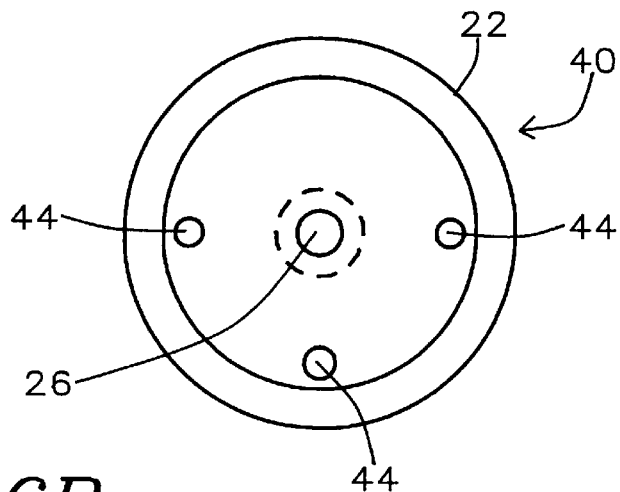
Figure 6C:
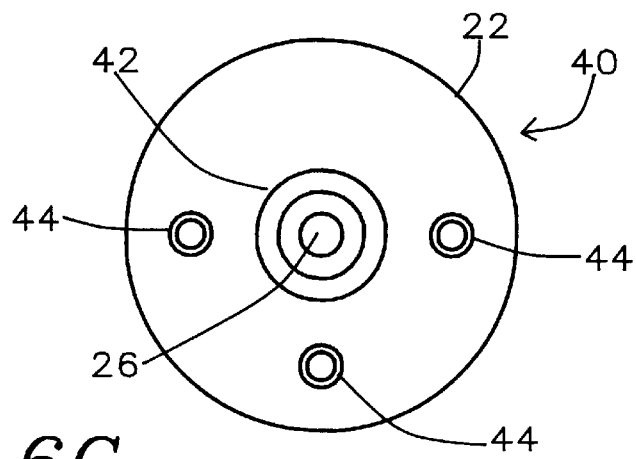
Figure 7:
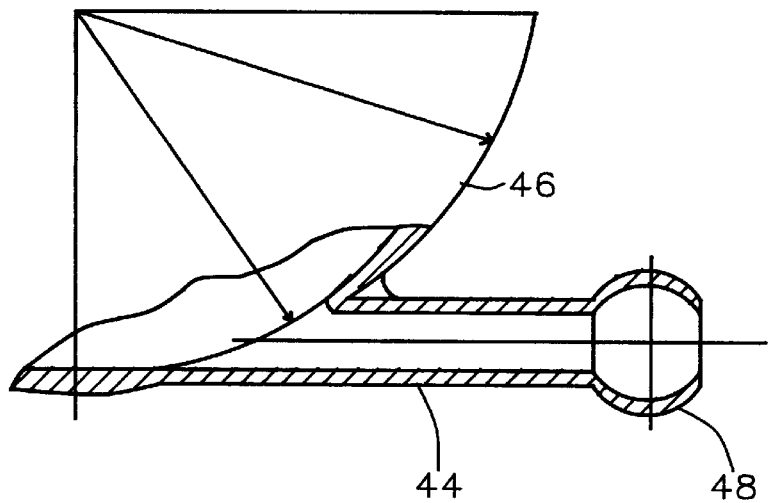
FIG. 7 is a crossectional detail view of a tube entry opening in the furnace.
Figure 8:
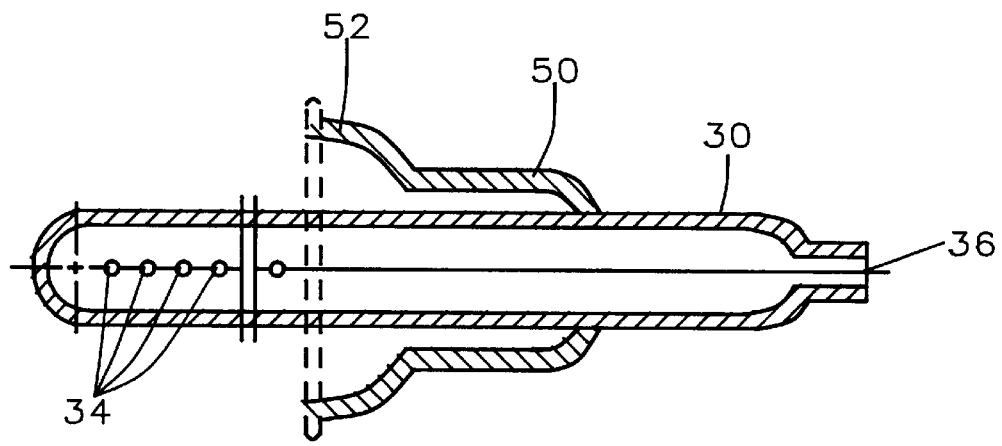
FIG. 8 is a crossectional detail view of a small tube with fitting for connection to the entry opening.

A more detailed furnace 40 is illustrated in FIGS. 6A, 6B and 6C. Furnace 40 has gas inlet 26 with an enlarged spherical end portion for connection to a suitable source of gas. As shown, there is provided a total of three small quartz tubes positioned on opposite sides and bottom of the furnace tube 22. A total of three inlets 44 for receiving the small tubes are provided on spherical wall 46. The inlet 44 is illustrated more clearly in FIG. 7 of the drawing in layer scale. The inlets 44 are fused to the spherical wall and are provided with a spherical end portion 48. The inside diameter of the protruding tube portion of inlet 44 is greater than the outside diameter of the small tubes 30. FIG. 8 depicts a fitting 50 that slips over tube 30 and is fused thereto. As shown, fitting 50 has a spherical end portion 52 that mates with portion 48 on inlet 44. The spherical shapes of portions 48 and 52 permit a minor adjustment of the position of the tubes 30 before the spherical portion are fused together.

In operation semiconductor wafers are placed on a suitable support and inserted within the furnace 20 or 40, as a unit through opening 24. The wafers are then heated to a temperature in the range of 800° to 1000° C. The opening 24 is closed and heated gases are flowed into the furnace through inlets 26, and inlets 36 of tubes 22. The gas can be any suitable single gas or a mixture of gases. In a reflow operation, a typical mixture consists of 90% $N_2$, and 10% $O_2$. When an anneal operation is performed, the gas can consist of 90% $N_2$ and 10% $O_2$. Other suitable mixtures are $N_2/O_2/H_2$, $O_2/H_2$, or $O_2$ only. The wafers 27 are maintained at a temperature in the range of 800° to 1000° C. by suitable heaters positioned around the furnace, indicated schematically as 50 in FIG. 5. In operation, the gases are flowed longitudinally along the tube 22 past the wafers 27, from inlet 26. Gases from inlet 26 also flow between the wafers by turbulence. However, the central surface positions are not subjected to sufficient flow by the gas from main inlet 26 to prevent formation of $BPO_4$ crystals. However, when gases are simultaneously introduced into furnace through small tubes 30, gas escapes from holes 34 and is directed across the surfaces of the wafers and perpendicular from the gas flow from main inlet 26. The wafer surface therefore are exposed to sufficient gas flow to prevent formation of $BPO_4$ and the deleterious effects of its formation. $BPO_4$ growth is due to $BPO_4$ over saturate in wafer center area, that is caused by gas diffusion (flow) slowdown in center area. $BPO_4$ is therefore eliminated or minimized by this invention.

While the invention has been particularly shown and described with reference to the preferred embodiments thereof, it will be understood by those skilled in the art that various changes in form and details may be made without departing from the spirit and scope of the invention.

What is claimed is:

1. An improved furnace for semiconductor device fabrication comprising:

a furnace tube formed of quartz having a large opening on one end to permit introduction and withdrawal of semiconductor wafers on a support;

at least one small quartz tube in said furnace tube extending parallel to the longitudinal axis of the furnace tube and spaced therefrom and located on a side of said semiconductor wafers when said support is positioned in said furnace tube;

said at least one small quartz tube having one open end for a gas inlet protruding outside of said furnace tube, and the opposite end being sealed by an end wall, said at least one small quartz tube mounted on said end wall with a swivel joint;

said at least one small quartz tube having a plurality of small holes of a diameter less than the inside diameter of the small tubes located along the tube surface facing the central longitudinal axis of the furnace tube;

a closure member for said large opening in said furnace tube, and a means to heat the interior of said furnace tube.

2. The furnace of claim 1 wherein said furnace has a circular cross section.

3. The furnace of claim 2 wherein said end wall on said opposite end is spherical shaped with said gas inlet centered in said wall.

4. The furnace of claim 3 wherein said quartz tubes penetrate said spherical end wall and are positioned in close relation to said furnace tube.

5. The furnace of claim 4 wherein said support for substrates is a boat provided with means to support the substrates in a spaced vertical position.

6. The furnace of claim 1 wherein there are two quartz tubes within said furnace tube.

7. The furnace of claim 1 wherein there are three quartz tubes within said furnace tube.

8. The furnace of claim 1 wherein said furnace tube and small tubes are formed of fused quartz.

* * * * *